(12) United States Patent
Chi et al.

(10) Patent No.: US 9,548,318 B1
(45) Date of Patent: Jan. 17, 2017

(54) CONNECTING TO BACK-PLATE CONTACTS OR DIODE JUNCTIONS THROUGH A RMG ELECTRODE AND RESULTING DEVICES

(71) Applicant: GLOBALFOUNDRIES Inc., Grand Cayman (KY)

(72) Inventors: Min-hwa Chi, Malta, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/936,848

(22) Filed: Nov. 10, 2015

(51) Int. Cl.
| | |
|---|---|
| H01L 21/3205 | (2006.01) |
| H01L 27/12 | (2006.01) |
| H01L 29/66 | (2006.01) |
| H01L 29/06 | (2006.01) |
| H01L 21/321 | (2006.01) |
| H01L 21/265 | (2006.01) |
| H01L 21/28 | (2006.01) |
| H01L 21/84 | (2006.01) |
| H01L 27/06 | (2006.01) |
| H01L 29/49 | (2006.01) |
| H01L 29/861 | (2006.01) |

(52) U.S. Cl.
CPC ..... *H01L 27/1203* (2013.01); *H01L 21/26513* (2013.01); *H01L 21/28079* (2013.01); *H01L 21/28088* (2013.01); *H01L 21/32115* (2013.01); *H01L 21/84* (2013.01); *H01L 27/0629* (2013.01); *H01L 29/0649* (2013.01); *H01L 29/495* (2013.01); *H01L 29/4966* (2013.01); *H01L 29/6609* (2013.01); *H01L 29/66545* (2013.01); *H01L 29/861* (2013.01)

(58) Field of Classification Search
USPC ................................................ 438/585, 595
See application file for complete search history.

(56) References Cited

U.S. PATENT DOCUMENTS

| | | | | |
|---|---|---|---|---|
| 8,664,103 B2 * | 3/2014 | Hempel | ............ | H01L 21/28176 257/369 |
| 2012/0315749 A1 * | 12/2012 | Hempel | ............ | H01L 21/28176 438/591 |
| 2016/0093713 A1 * | 3/2016 | Xie | ................. | H01L 21/28008 257/411 |

OTHER PUBLICATIONS

Grenouillet et al., "UTBB FDSOI transistors with dual STI for a multi-Vt strategy at 20nm node and below", Dec. 10-13, 2012, Electron Devices Meeting (IEDM), IEEE International, 4 pages.

* cited by examiner

*Primary Examiner* — Telly Green
(74) *Attorney, Agent, or Firm* — Ditthavong & Steiner, P.C.

(57) ABSTRACT

Methods to connect to back-plate (BP) or well contacts or diode junctions through a RMG electrode in FDSOI technology based devices and the resulting devices are disclosed. Embodiments include providing a polysilicon dummy gate electrode between spacers and extending over a BP, an active area of a transistor, and a shallow-trench-isolation (STI) region therebetween; providing an interlayer dielectric surrounding the spacers and polysilicon dummy gate electrode; removing the polysilicon dummy gate electrode creating a cavity between the spacers; forming a high-k dielectric layer and a work-function (WF) metal layer in the cavity; removing a section of the WF metal layer, high-k dielectric layer, and STI region exposing an upper surface of the BP; filling the cavity with a metal forming a replacement metal gate electrode; and planarizing the metal down to an upper surface of the spacers.

12 Claims, 9 Drawing Sheets

BACKGROUND

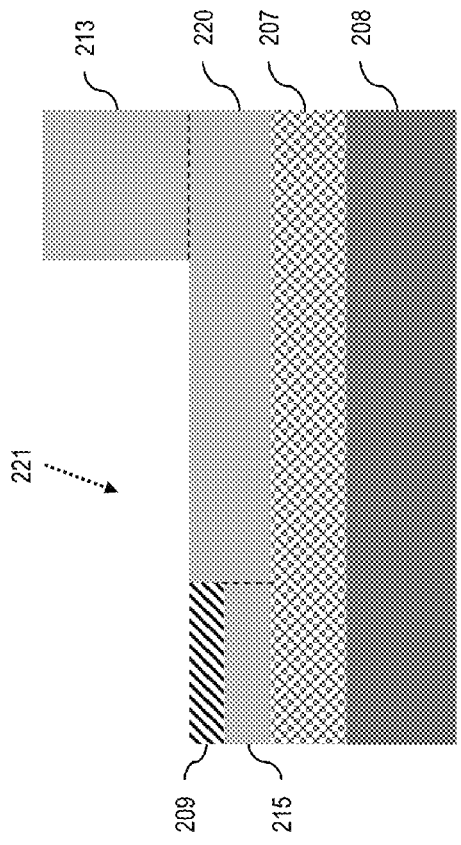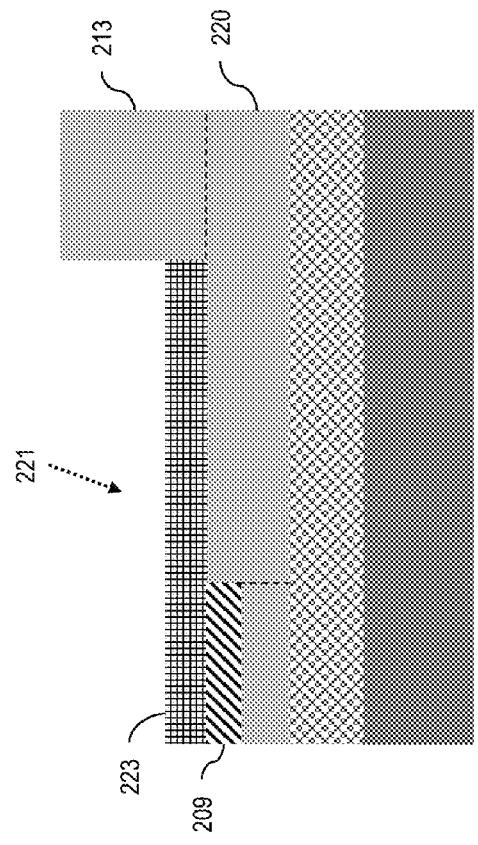
FIG. 2E
FIG. 2F

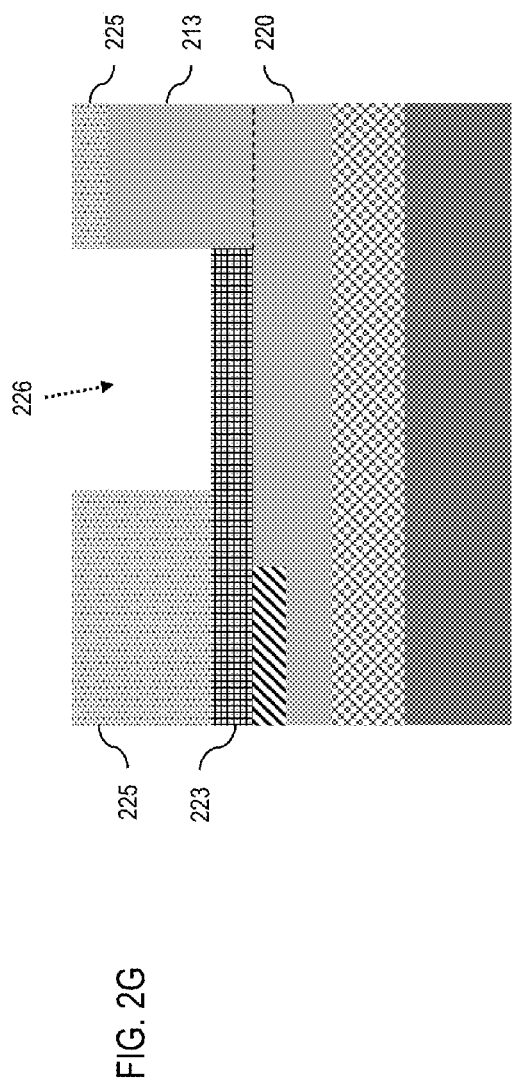
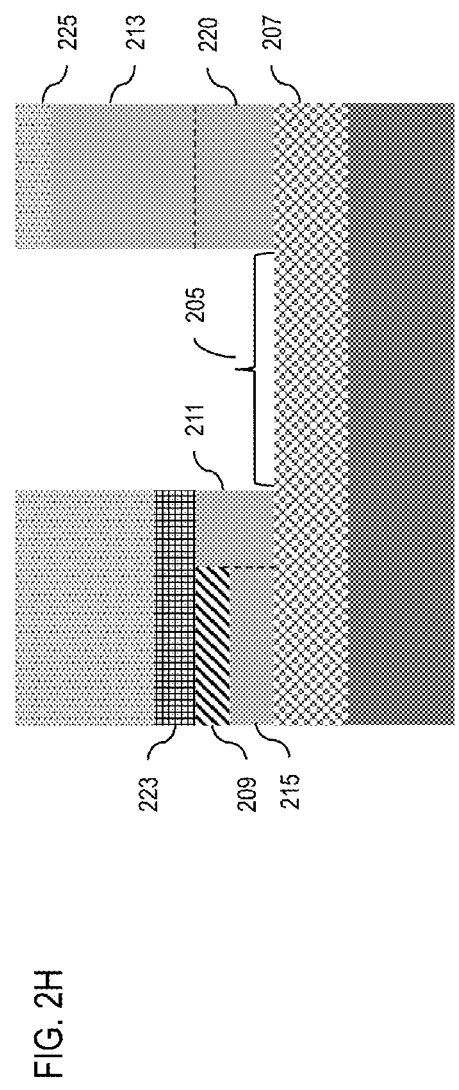
FIG. 2G
FIG. 2H

CONNECTING TO BACK-PLATE CONTACTS OR DIODE JUNCTIONS THROUGH A RMG ELECTRODE AND RESULTING DEVICES

TECHNICAL FIELD

The present disclosure relates generally to designing and fabricating integrated circuit (IC) devices. The present disclosure is particularly applicable to design and fabrication of IC devices utilizing silicon-on-insulator (SOI) technology and metal gate based processes to form front-end-of-line (FEOL) contacts and components.

BACKGROUND

Generally, an IC device may include a variety of components and elements such as transistors, diodes, contacts, capacitors, inductors, or the like, which may provide various functionalities in operation of an IC device. Some IC devices may be based on SOI technology where the components of the IC device are formed in a silicon (Si) layer above the insulator (e.g., buried-oxide (BOX)) layer, which may provide a good isolation from a Si substrate for the IC device. SOI based devices commonly include protection diodes (e.g., connecting to a gate of a transistor) and back-plate (BP) or transistor well contacts (e.g., for backside biasing for tuning threshold voltage of a component in the IC device). In some scenarios, n-type or p-type BPs and wells under SOI transistors may be formed by implantation of n-type or p-type dopant species selectively (e.g., by lithography/mask steps). Deep and/or shallow trench isolation regions may be formed to isolate adjacent well-to-well and/or BP-to-BP areas, respectively.

FIG. 1 schematically illustrates an example circuit in an IC device including a protection diode 101 connected to a metal gate line (or a polysilicon gate line) 103 of a transistor 105. The transistor on SOI substrate is separated from its BP 107 vertically by a BOX layer 109. The diode can provide protection against electrical charge (e.g., during fabrication processes or from the external environment of an IC device via its input/output elements) that may accumulate at the gate 111 of the transistor causing damage. However, for SOI technology, devices (e.g., transistors) are on the SOI layer and isolated from the Si substrate by the BOX layer. Standard P-N junction based diodes cannot serve as protection diodes as they are on the BOX layer and cannot release accumulated electrical charge to the Si substrate. Moreover, implementing the contacts to BP or well or formation of a diode in a well may require extra lithography steps as well as more complex processes (e.g., etching through the BOX layer, implants for forming diode junctions or contacts to the Si substrate), special contact formation schemes (e.g., through a trench silicide (TS)/active area contact (CA)/gate contact (CB)), and a large layout area for circuit implementation that may impact fabrication time, cost, and reliability of an IC device.

Therefore, a need exists for a methodology enabling efficient connection to substrate contacts or diode junctions in SOI based devices and resulting devices.

SUMMARY

An aspect of the present disclosure is a method of enabling connection to a well or BP in a Si substrate or (with additional implanting the well or BP area with a dopant) connection to diode junctions in an IC device through a replacement-metal-gate (RMG) electrode in SOI technology based on a "gate-last" or RMG process flow.

Another aspect of the present disclosure is an IC device including connection to a well or BP in a substrate or (with additional implanting the well or BP) connection to diode junctions through a RMG electrode in SOI technology based devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a polysilicon dummy gate electrode between spacers and extending over a contact area of a BP, an active area of a transistor, and a shallow trench isolation (STI) region therebetween; providing an interlayer dielectric (ILD) surrounding the spacers and polysilicon dummy gate electrode; removing the polysilicon dummy gate electrode creating a cavity between the spacers; forming a high-k dielectric layer and a work function (WF) metal layer in the cavity; removing a section of the WF metal layer, high-k dielectric layer, and STI region exposing an upper surface of the BP; filling the cavity with a metal forming a RMG electrode; and planarizing the metal down to an upper surface of the spacers.

In one aspect, the BP includes doped silicon, and prior to filling the cavity with the metal, the method includes implanting the exposed upper surface of the BP with a diode dopant forming a diode junction, wherein a polarity of the diode dopant is different than a polarity of the doped silicon. In one aspect, the RMG electrode connects the diode junction to a transistor gate. In another aspect, the RMG electrode connects the BP to a transistor gate.

In one aspect, the metal includes titanium nitride/titanium/aluminum (TiN/Ti/Al) or tungsten (W). An additional aspect includes forming the RMG electrode over a Si layer, an insulator layer, and a Si substrate stack. In a further aspect, the active area is in the Si layer. In another aspect, the BP is in the Si substrate. In one aspect, a remaining section of the high-k dielectric layer is over the Si layer in the active area.

According to the present disclosure, some technical effects may be achieved in part by a device including: a Si layer over an insulator layer over a Si substrate, respectively; a BP separated from an active area of a transistor by a STI region; and a RMG electrode connecting the BP to a transistor gate.

In another aspect, the BP includes doped silicon and an upper surface is implanted with a diode dopant forming a diode junction, wherein a polarity of the diode dopant is different than a polarity of the doped silicon.

In one aspect, the RMG electrode connects the diode junction to the transistor gate. In an additional aspect, the RMG electrode is TiN/Ti/Al or W. In another aspect, the RMG electrode extends over the Si layer, insulator layer, and Si substrate stack. In a further aspect, the active area is in the Si layer. In another aspect, the BP is in the Si substrate. Another aspect includes a high-k dielectric layer under the RMG electrode in the active area.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2J schematically illustrate forming connection to substrate well or BP contacts or diode junctions in an IC device through a RMG electrode in SOI technology based devices, in accordance with an exemplary embodiment.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of a need for additional process steps and layout area attendant upon forming protection diodes in SOI based devices, e.g. connecting to substrate contacts of wells and BPs or diode junctions, in an IC device. The present disclosure addresses and solves such problems, for instance, by, inter alia, connecting to substrate contacts or diode junctions in an IC device through a RMG electrode in SOI technology.

FIGS. 2A through 2J schematically illustrate forming connection to substrate well or BP contacts or diode junctions in an IC device through a RMG electrode in SOI technology based devices, in accordance with an exemplary embodiment.

Figure 1:
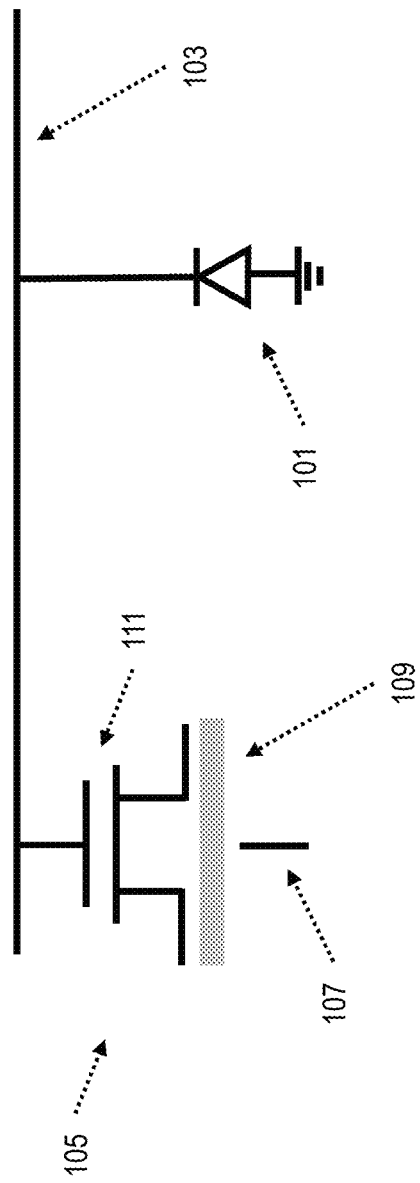
FIG. 1 schematically illustrates an example circuit in an IC device.
Figure 2A:
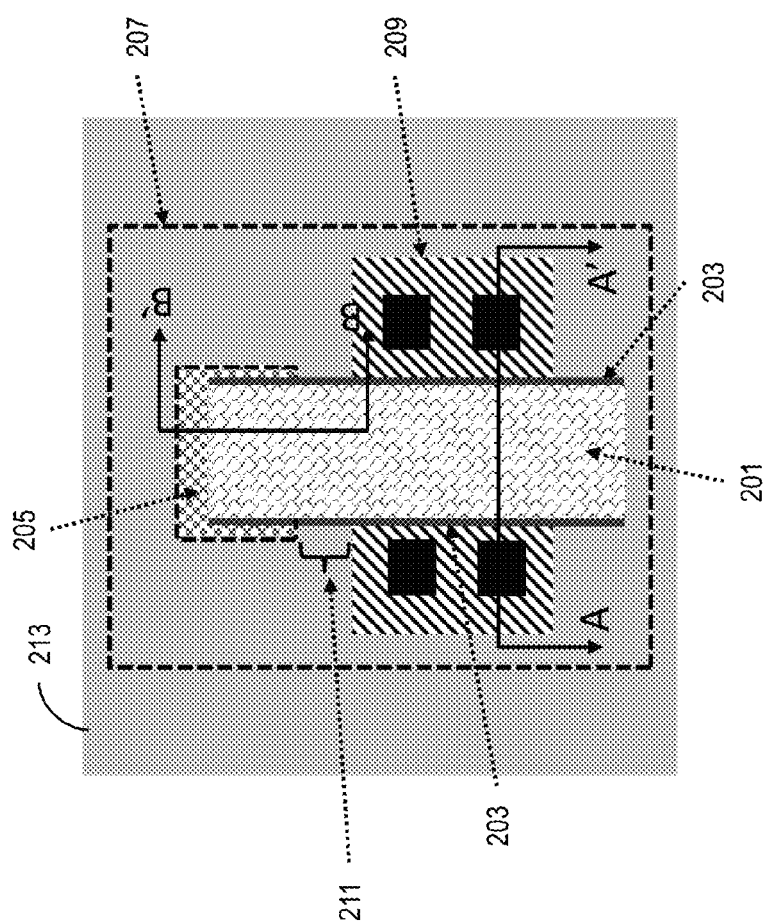

FIG. 2A illustrates a top view of a transistor in a SOI stack including a polysilicon dummy gate electrode 201, between spacers 203, a BP contact area 205 to a BP 207 in a Si substrate 208 (shown in figures below), and a Si active area 209. The BP 207 may be an upper portion of the Si substrate 208 (shown in figures below) under a BOX layer (shown in figures below) in the transistor area. The BP contact area 205 may be implanted with a dopant (e.g., n+ or p+) according to the transistor well (e.g., n-well or p-well) or the polarity of the BP 207 (e.g., n-type or p-type) where the BP contact area 205 is located. Also illustrated is a STI region 211 between the BP contact area 205 and the active area 209. An ILD 213 (e.g., oxide) may be formed around the dummy gate electrode 201 and the spacers 203. Also, cross sectional lines A-A' (CS view-A) and B-B' (CS view-B) are shown for reference when discussing cross sectional views in figures below.

Figure 2B:
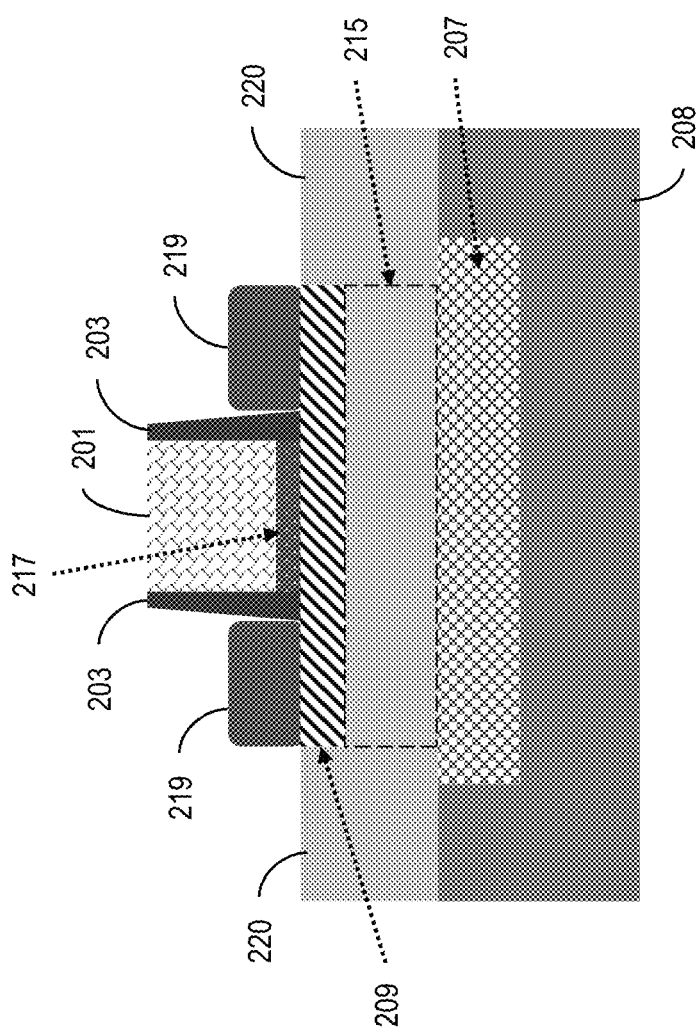

Adverting to FIG. 2B, a CS view-A illustrates an insulator layer 215 (e.g., BOX) between the BP 207 (in the Si substrate 208) and the active area 209. A gate dielectric layer 217 is formed under the dummy gate electrode 201, between the spacers 203. Additionally, source/drain (S/D) regions 219 may be formed (e.g., by epitaxial growth) on opposite sides of the dummy gate, on the active area 209. STI (e.g., oxide) regions 220 separate the active area 209 from other adjacent active areas that may be on either side.

The structure of FIG. 2B may be formed by conventional processing. For example, silicon fins and STI and deep trench isolation (DTI) regions may be formed by depositing and patterning a hard mask, etching the STI regions, depositing and patterning a second hard mask, etching the DTI regions, filling the gaps with an oxide, performing CMP, annealing, and removing the hard masks. Next, the n/p well and BP are patterned, n/p and BP implants are performed, and the implants are driven in by annealing. Then the dummy gate stack 201 is formed by depositing and pattering a gate dielectric 217 and polysilicon. First spacers (e.g. of nitride) are formed, halo implants (not shown for illustrative convenience) are performed, and second spacers 203 are formed so that the S/D regions 219 may be epitaxially grown and doped either in-situ or by implant doping. The S/D regions may be epitaxial silicon germanium (eSiGe) for p-type S/D regions or epitaxial Si for n-type S/D regions.

Figure 2C:
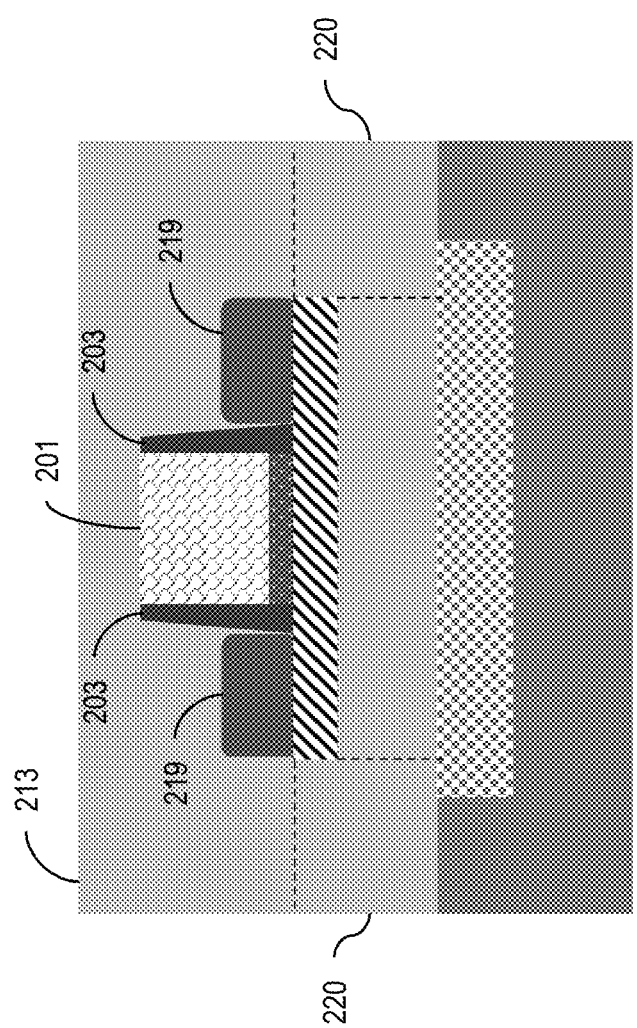
Figure 2D:
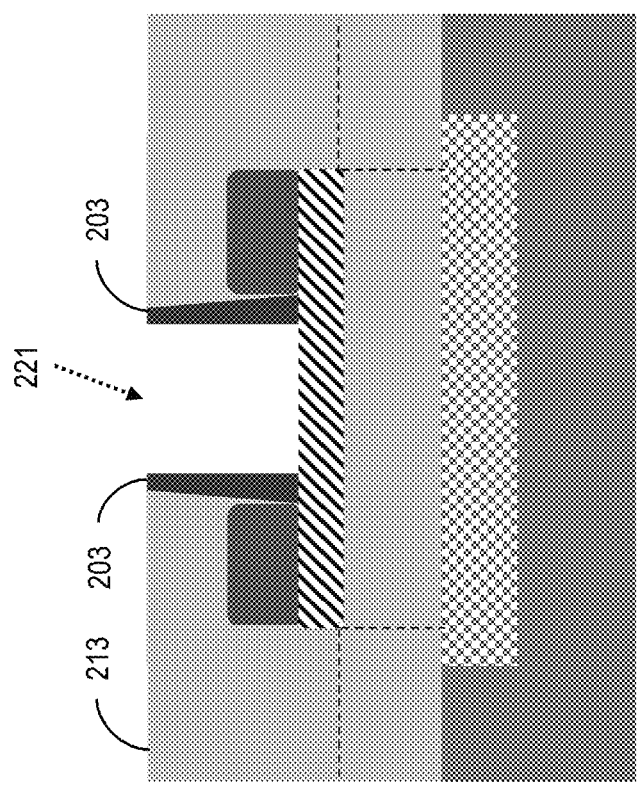

In FIG. 2C, the ILD 213 is formed covering the polysilicon dummy gate electrode 201, the spacers 203, the S/D epi 219, and the STI regions 220. In FIG. 2D, the ILD 213 may be polished (e.g., by CMP) down to the upper surfaces of the spacers 203 so that the dummy gate electrode 201 and its dielectric 217 may be removed according to conventional RMG processing to create a cavity 221 between the spacers 203.

FIG. 2E illustrates a CS view-B showing part of the cavity 221 (formed by the removal of the dummy gate electrode 201 and its dielectric 217), the Si substrate 208, the BP 207, the ILD 213, the active area 209, and the STI region 220. Adverting to FIG. 2F, an interfacial layer (e.g. an oxide layer), a high-k dielectric layer, and a WF metal layer, together shown as layer 223, may be formed (e.g., by atomic layer deposition) in the cavity 221 over an exposed upper surface of the STI region 220 and the active area 209. A WF metal layer may be selected based on a type of transistor (e.g., n-type, p-type) that is to be formed. For instance, an n-type WF metal layer such as titanium aluminide (TiAl) or titanium carbide (TiC) would be in contact with the high-k dielectric layer in an n-type transistor, and a p-type WF metal layer such as titanium nitride (TiN) would be in contact with the high-k dielectric layer in a p-type transistor. The n-type WF may be deposited to a thickness of 20 to 30 Å, and the p-type WF layer may be deposited to a thickness of 20 to 40 Å. The p-type WF layer may be deposited in both PFET and NFET areas, removed (by masking and etching) from the NFET area, and then the n-type WF layer may be deposited.

Adverting to FIG. 2G, a photoresist mask 225 with an opening 226, over a section of the layer 223, may be utilized to remove (e.g. by etching) a section of the layer 223 (e.g., the WF metal layer, high-k dielectric layer, and interfacial layer) and the STI region 220 to expose an upper surface of a section of the BP 207, i.e., BP contact area 205 as illustrated in FIG. 2H. Also shown is STI region 211 adjacent to the active area 209 and the insulator layer 215. The remainder of the layer 223 and the ILD 213 are protected by the photoresist mask 225. The protected portion of the layer 223 is over the Si layer in the active area 209. Once the layer 223 is etched, photoresist mask 225 may be removed.

Figure 2I:
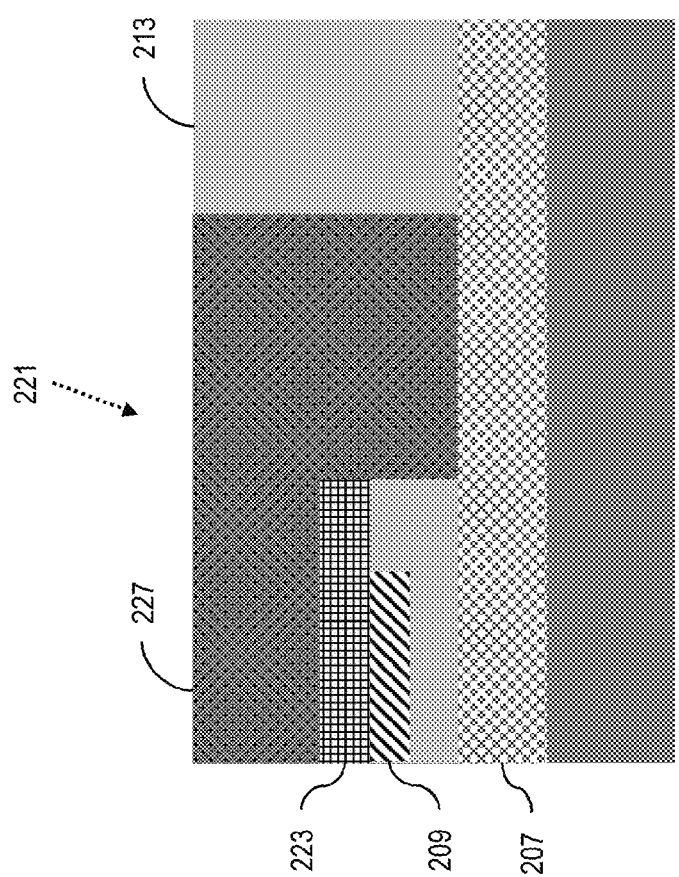

In FIG. 2I, the cavity 221 may be filled with one or more layers of metallic material (e.g., TiN/Ti/Al, or W) to form a RMG electrode 227, which can connect the BP 207 (e.g., BP contact area 205) or the transistor well area to the active area 209, via the layer 223. The RMG electrode 227 extends over the active area 209 (Si layer), the insulator layer 211, and the Si substrate stack 208. Next, the RMG electrode 227/ metallic material may be planarized down to an upper surface of the spacers 203 (shown in FIGS. 2B through 2D).

Figure 2J:
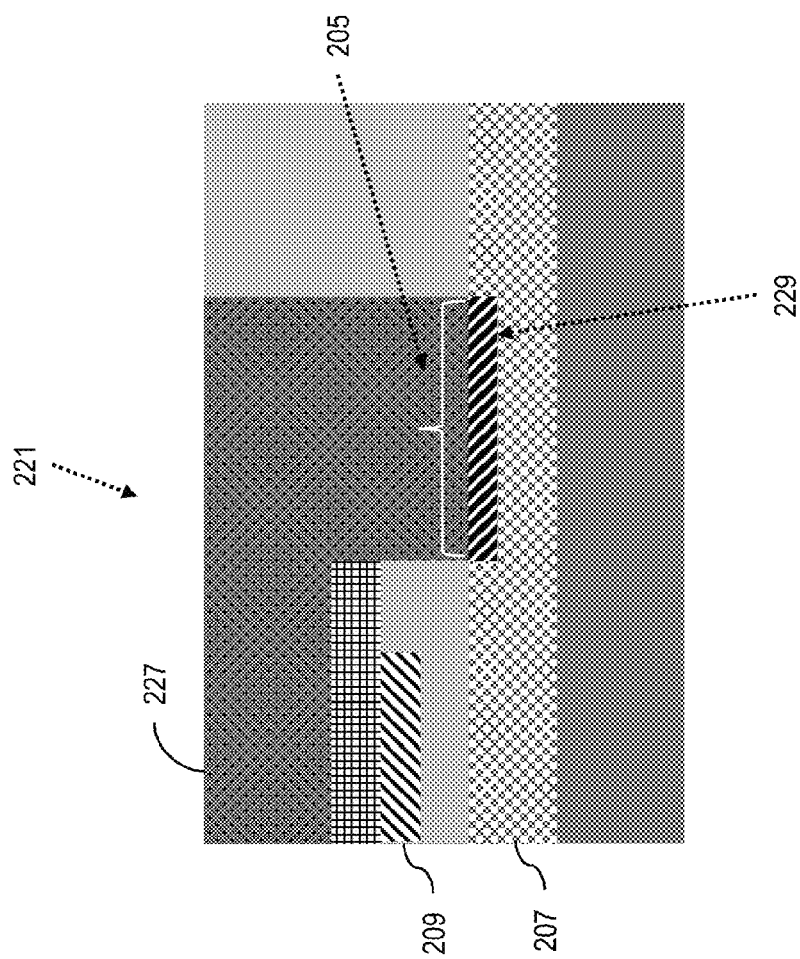

However, as illustrated in FIG. 2J, prior to filling the cavity 221 with the metallic material 227, the exposed upper surface of the BP contact area 205 may be implanted with a diode dopant to form a diode junction 229, where subsequently the RMG electrode 227 can connect the diode junction 229 to the active area 209 (and to the transistor gate). As the BP 207 includes doped silicon, a polarity of the diode dopant may be different than a polarity of the doped silicon. Various combinations of the diode dopant and the BP dopant may be utilized to provide for different diode polarities, e.g., PN or NP junction diodes.

After the metal fill, conventional processing may continue (not shown for illustrative convenience) with the deposition of a nitride and tetraethyl orthosilicate (TEOS) oxide, formation of a silicide trench (e.g., by lithographic masking and etching), Ti/TiN deposition, and titanium silicide (TiSi) formation. Contacts may be patterned, filled with tungsten, and planarized by CMP, and back-end-of-line (BEOL) interconnections may be formed.

The embodiments of the present disclosure can achieve several technical effects including connecting to substrate well or BP contacts or diode junctions through a RMG electrode in SOI technology based devices without reliance on TS/CA/CB contacts, a more efficient layout area, and without additional process steps. The proposed methods may be applicable for both planar and FinFET technologies. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use static-random-access memory (SRAM) cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a polysilicon dummy gate electrode between spacers and extending over a contact area of a backplate (BP), an active area of a transistor, and a shallow trench isolation (STI) region therebetween;
providing an interlayer dielectric (ILD) surrounding the spacers and polysilicon dummy gate electrode;
removing the polysilicon dummy gate electrode creating a cavity between the spacers;
forming a high-k dielectric layer and a work function (WF) metal layer in the cavity;
removing a section of the WF metal layer, high-k dielectric layer, and STI region exposing an upper surface of the BP;
filling the cavity with a metal forming a replacement metal gate (RMG) electrode; and
planarizing the metal down to an upper surface of the spacers.

2. The method according to claim 1, wherein the BP comprises doped silicon, the method further comprising:
prior to filling the cavity with the metal, implanting the exposed upper surface of the BP with a diode dopant forming a diode junction, wherein a polarity of the diode dopant is different than a polarity of the doped silicon.

3. The method according to claim 2, wherein the RMG electrode connects the diode junction to a transistor gate.

4. The method according to claim 1, wherein the RMG electrode connects the BP to a transistor gate.

5. The method according to claim 1, wherein the metal includes titanium nitride/titanium/aluminum (TiN/Ti/Al) or tungsten (W).

6. The method according to claim 1, comprising forming the RMG electrode over a silicon (Si) layer, an insulator layer, and a Si substrate stack.

7. The method according to claim 6, wherein the active area is in the Si layer.

8. The method according to claim 6, wherein the BP is in the Si substrate.

9. The method according to claim 6, wherein a remaining section of the high-k dielectric layer is over the Si layer in the active area.

10. A method comprising:
providing a polysilicon dummy gate electrode between spacers and extending over a contact area of a backplate (BP), an active area of a transistor, and a shallow trench isolation (STI) region therebetween;
providing an interlayer dielectric (ILD) surrounding the spacers and polysilicon dummy gate electrode;
removing the polysilicon dummy gate electrode creating a cavity between the spacers;
forming a high-k dielectric layer and a work function (WF) metal layer in the cavity;
removing a section of the WF metal layer, high-k dielectric layer, and STI region exposing an upper surface of the BP;
filling the cavity with a metal comprising titanium nitride/titanium/aluminum (TiN/Ti/Al) or tungsten (W), forming a replacement metal gate (RMG) electrode connecting the BP to a transistor gate; and
planarizing the metal down to an upper surface of the spacers.

11. The method according to claim 10, wherein the BP comprises doped silicon, the method further comprising:
prior to filling the cavity with the metal, implanting the exposed upper surface of the BP with a diode dopant forming a diode junction, wherein a polarity of the diode dopant is different than a polarity of the doped silicon, wherein the RMG electrode connects the diode junction to the transistor gate.

12. The method according to claim 10, comprising forming the RMG electrode over a silicon (Si) layer, an insulator layer, and a Si substrate stack, wherein the active area is in the Si layer, the BP is in the Si substrate, and a remaining section of the high-k dielectric layer is over the Si layer in the active area.

* * * * *